(12) United States Patent
Saito

(10) Patent No.: US 11,515,125 B2
(45) Date of Patent: Nov. 29, 2022

(54) UPPER ELECTRODE AND PLASMA PROCESSING APPARATUS

(71) Applicant: TOKYO ELECTRON LIMITED, Tokyo (JP)

(72) Inventor: Michishige Saito, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 103 days.

(21) Appl. No.: 16/296,827

(22) Filed: Mar. 8, 2019

(65) Prior Publication Data

US 2019/0272977 A1 Sep. 5, 2019

Related U.S. Application Data

(62) Division of application No. 14/415,258, filed as application No. PCT/JP2013/068167 on Jul. 2, 2013, now abandoned.

(60) Provisional application No. 61/674,509, filed on Jul. 23, 2012.

(30) Foreign Application Priority Data

Jul. 17, 2012 (JP) .................. 2012-158841

(51) Int. Cl.
*H01J 37/32* (2006.01)
*C23C 4/11* (2016.01)
*C23C 4/04* (2006.01)
*C23C 4/12* (2016.01)

(52) U.S. Cl.
CPC ............ *H01J 37/3255* (2013.01); *C23C 4/04* (2013.01); *C23C 4/11* (2016.01); *C23C 4/12* (2013.01); *H01J 37/3244* (2013.01); *H01J 37/32532* (2013.01); *H01J 37/32568* (2013.01)

(58) Field of Classification Search
CPC .................................................. H01J 37/32532
See application file for complete search history.

(56) References Cited

U.S. PATENT DOCUMENTS 5,569,356 A * 10/1996 Lenz .................. H01J 37/32009
　　　　　　　　　　　　　　　　　　　　　　　438/729
6,121,540 A * 9/2000 Takeda .............. H01L 31/03921
　　　　　　　　　　　　　　　　　　　　　　　136/244
(Continued)

FOREIGN PATENT DOCUMENTS

JP　　　7-216589 A　　8/1995
JP　　　2007-224348 A　　9/2007
(Continued)

OTHER PUBLICATIONS

International Search Report dated Oct. 1, 2013 in PCT/JP2013/068167.

*Primary Examiner* — Keath T Chen
(74) *Attorney, Agent, or Firm* — Weihrouch IP

(57) ABSTRACT

In an exemplary embodiment, an upper electrode is disposed in a processing chamber to face a susceptor and provided with a plate-like member and an electrode part. In an exemplary embodiment, the plate-like member is formed with a gas distribution hole that distributes a processing gas used for a plasma processing. The electrode part is formed in a film shape by thermally spraying silicon onto a surface of the plate-like member where an outlet of the gas distribution hole is formed.

8 Claims, 5 Drawing Sheets

(56) References Cited

U.S. PATENT DOCUMENTS

| | | | |
|---|---|---|---|
| 6,197,151 B1 * | 3/2001 | Kaji | H01J 37/32678 |
| | | | 156/345.46 |
| 6,228,438 B1 * | 5/2001 | Schmitt | C23C 16/4583 |
| | | | 118/723 E |
| 7,104,217 B2 | 9/2006 | Himori et al. | |
| 2003/0155078 A1 | 8/2003 | Ogasawara et al. | |
| 2004/0020431 A1 * | 2/2004 | Himori | H01J 37/32009 |
| | | | 118/723 E |
| 2005/0061445 A1 | 3/2005 | Koshiishi et al. | |
| 2005/0215073 A1 * | 9/2005 | Nakamura | H01L 21/6831 |
| | | | 438/778 |
| 2005/0270895 A1 * | 12/2005 | Strang | B01J 4/001 |
| | | | 366/107 |
| 2007/0068798 A1 | 3/2007 | Honda et al. | |
| 2007/0256638 A1 | 11/2007 | Honda et al. | |
| 2009/0041568 A1 | 2/2009 | Muraoka et al. | |
| 2012/0222815 A1 * | 9/2012 | Sabri | C23C 16/45565 |
| | | | 156/345.34 |
| 2012/0251721 A1 * | 10/2012 | Matsumoto | C23C 16/40 |
| | | | 427/248.1 |

FOREIGN PATENT DOCUMENTS

| | | | | |
|---|---|---|---|---|
| JP | 2007-243020 A | | 9/2007 | |
| JP | 2007-273596 A | | 10/2007 | |
| JP | 2011026634 | * | 2/2011 | ......... H02L 21/0262 |
| JP | 2012-109377 A | | 6/2012 | |

* cited by examiner

UPPER ELECTRODE AND PLASMA PROCESSING APPARATUS

CROSS REFERENCE TO RELATED APPLICATIONS

This application is a divisional of U.S. patent application Ser. No. 14/415,258, filed Jan. 16, 2015, which is a national phase of PCT Application No. PCT/JP2013/068167, filed Jul. 2, 2013, which claims priority from Japanese Patent Application No. 2012-158841, filed Jul. 17, 2012, and U.S. Provisional Application No. 61/674,509, filed on Jul. 23, 2012, the disclosures of which are incorporated herein their entirety by reference, and priority is claimed to each of the foregoing.

TECHNICAL FIELD

Various aspects and embodiments of the present disclosure relate to an upper electrode and a plasma processing apparatus.

BACKGROUND

In semiconductor device manufacturing processes, plasma processing apparatuses have been widely used to perform plasma processings for the purpose of, for example, depositing or etching a thin film. The plasma processing apparatuses may involve, for example, a plasma chemical vapor deposition (CVD) apparatus that performs a deposition processing of a thin film and a plasma etching apparatus that performs an etching processing.

The plasma processing apparatus includes, for example, a processing container that defines a plasma processing space, a placing table that is provided in the processing container to place a substrate to be processed thereon, and an upper electrode that is disposed to face the placing table across the plasma processing space and includes a conductive electrode plate.

In the plasma processing apparatus, since the upper electrode is exposed directly to plasma, the temperature of the upper electrode is increased. Therefore, it has been known that an electrode plate of the upper electrode is provided on a relatively highly heat-conductive member in order to suppress the increase of temperature. For example, Patent Document 1 discloses that a plate-like member including a flow path of a processing gas for a plasma processing is formed of a conductive material having high heat conductivity, and an electrode plate of an upper electrode is detachably provided on a surface of the plate-like member where the outlet of the flow path is formed, thereby performing the cooling of the electrode plate.

PRIOR ART DOCUMENT

Patent Document

Patent Document 1: Japanese Patent Laid-Open Publication No. 2007-273596

DISCLOSURE OF THE INVENTION

Problems to be Solved

However, it was difficult to maintain the uniformity of the temperature of the upper electrode in the prior art. That is, in the prior art, since the electrode plate is detachably provided on the surface of the plate-like member where the outlet of the processing gas flow path is formed, the electrode plate is bent by its own weight so that a gap is generated between the plate-like member and the electrode plate. Therefore, heat is hardly transmitted from the electrode plate to the plate-like member. As a result, the uniformity of the temperature of the upper electrode may be impaired in the prior art.

Means to Solve the Problems

An upper electrode according to an aspect of the present disclosure includes a plate-like member and an electrode part. The plate-like member is provided with a flow path that distributes a processing gas used for a plasma processing. The electrode part is formed in a film shape by thermal spraying of silicon onto a surface of the plate-like member where an outlet of the flow path is formed.

Effect of the Invention

According to various aspects and embodiments of the present disclosure, an upper electrode and a plasma processing apparatus are realized, in which the uniformity of the temperature of the upper electrode may be maintained.

DETAILED DESCRIPTION TO EXECUTE THE INVENTION

Figure 1:
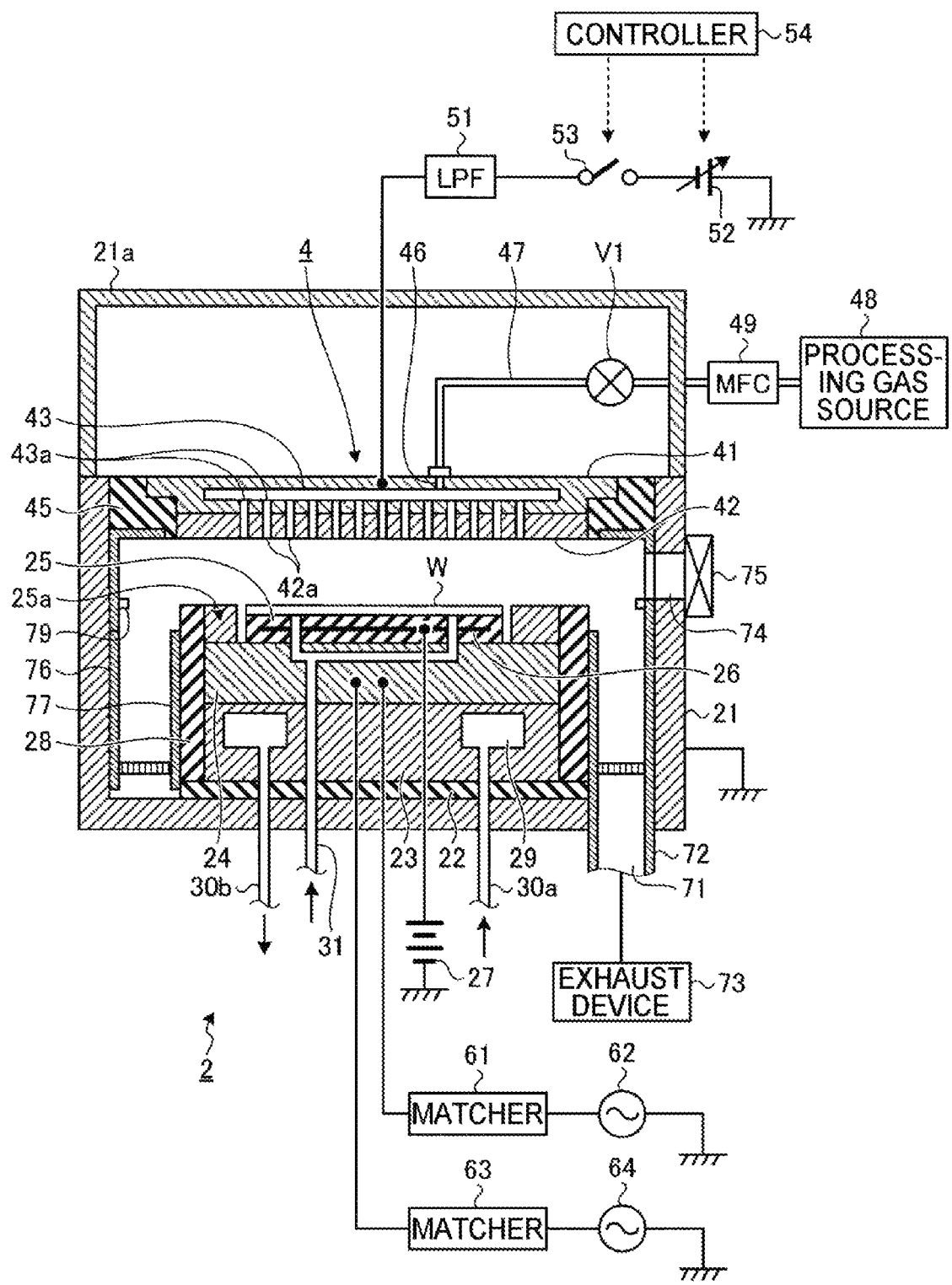
FIG. 1 is a vertical cross-sectional view schematically illustrating a configuration of a plasma processing apparatus according to an exemplary embodiment.

Hereinafter, various exemplary embodiments of the present disclosure will be described with reference to drawings. Meanwhile, in each drawing, the same or corresponding parts will be denoted by the same reference numerals.

First, the entire configuration of a plasma processing apparatus will be described. FIG. 1 is a vertical cross-sectional view schematically illustrating a configuration of a plasma processing apparatus according to an exemplary embodiment.

A plasma processing apparatus 2 is configured as a capacitively coupled parallel-plate plasma etching apparatus, and includes a processing chamber 21 serving as a processing container that defines a plasma processing space for a plasma processing. On the bottom of the processing chamber 21 serving as a processing container, a support base 23 is disposed via an insulating plate 22 that is made of a ceramic. A susceptor 24 made of, for example, aluminum and constituting a lower electrode is provided on the support base 23. An electrostatic chuck 25 is provided in a central upper portion of the susceptor 24 to attract and hold a wafer W serving as a substrate to be processed by an electrostatic force. The electrostatic chuck 25 has a configuration in which an electrode 26 formed of a conductive film is sandwiched between a pair of insulating layers. The electrode 26 is electrically connected with a direct current (DC) power supply 27.

In order to improve a uniformity of etching, a conductive focus ring (correction ring) 25a made of, for example, silicon is disposed on the top of the susceptor 24 so as to surround the electrostatic chuck 25. Reference numeral "28" in the drawing denotes a cylindrical inner wall member made of, for example, quartz, and provided to surround the susceptor 24 and the support base 23.

Inside the support base 23, a coolant chamber 29 is formed, for example, along the circumferential direction of the support base 23. A coolant at a predetermined temperature, for example, cooling water is circulated and supplied from a chiller unit (not illustrated), which is provided outside, into the coolant chamber 29 through pipes 30a, 30b. The processing temperature of the wafer W on the susceptor 24 may be controlled by the temperature of the coolant. Further, a heat transfer gas, for example, helium (He) gas, supplied from a heat transfer gas supplying unit (not illustrated) to a gap between the upper surface of the electrostatic chuck 25 and the rear surface of the wafer W through a gas supply line 31.

An upper electrode 4 is provided above the susceptor 24, which is the lower electrode, to face the susceptor 24 across the plasma processing space of the processing chamber 21. A space between the upper electrode 4 and the susceptor 24 forms the plasma processing space that generates plasma.

Figure 2:
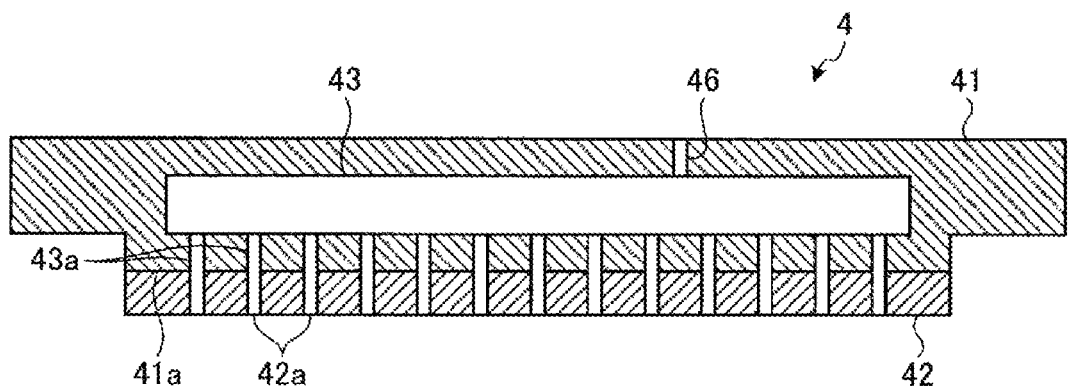
FIG. 2 is a vertical cross-sectional view illustrating the upper electrode according to the exemplary embodiment.

Here, a configuration of the upper electrode 4 will be described in detail. FIG. 2 is a vertical cross-sectional view illustrating the upper electrode according to an exemplary embodiment. As illustrated in FIG. 2, the upper electrode 4 includes a plate-like member 41 as an electrode body, and an electrode part 42.

The plate-like member 41 is supported in an upper portion of the processing chamber 21 by an insulating shielding member 45. The plate-like member 41 is formed in a disc shape by a conductive material having relatively high heat conductivity such as, for example, aluminum, the surface of which is anodized, and functions as a cooling plate to cool the electrode part 42 which is heated by the plasma generated in the plasma processing space. The plate-like member 41 includes therein a gas introduction port 46 that introduces a processing gas for the plasma processing, a gas diffusion chamber 43 that diffuses the processing gas introduced from the gas introduction port 46, and gas distribution holes 43a serving as flow paths that distribute the processing gas diffused by the gas diffusion chamber 43.

The electrode part 42 is formed in a film shape by thermally spraying silicon onto a surface 41a of the plate-like member 41 where the outlets of the gas distribution holes 43a are formed. In the present exemplary embodiment, the electrode part 42 is formed in a film shape, as well as in a disc shape corresponding to the shape of the plate-like member 41, by thermally spraying silicon onto the surface 41a of the plate-like member 41 where the outlets of the gas distribution holes 43a are formed. As for a method of thermally spraying silicon, a plasma spraying method may be used, for example. The plasma spraying method is a film forming method, in which a film is formed by energizing a rare gas in a nozzle to generate a plasma flow, feeding a thermal spraying material such as, for example, powdered silicon, into the generated plasma flow, and injecting the plasma flow fed with the thermal spraying material to a workpiece from the nozzle. The plasma spraying method is characterized by a relatively high adhesion between the workpiece and the film. Further, the film formed by the plasma spraying method is characterized by a high hardness, a strong adhesion between particles, a high density, and a smooth shape. Meanwhile, the plasma spraying method is also characterized in that a thermal distortion of the workpiece is small, and that deterioration of the workpiece may be suppressed.

The electrode part 42 includes gas introduction holes 42a formed to penetrate the electrode part 42 in the thickness direction. The gas introduction holes 42a are arranged to be overlapped with the outlets of the gas distribution holes 43a of the plate-like member 41. Therefore, the processing gas supplied to the gas diffusion chamber 43 is diffused in a shower form and supplied into the processing chamber 21 through the gas distribution holes 43a and the gas introduction holes 42a.

Further, in the present exemplary embodiment, when the electrode part 42 is formed by thermally spraying silicon, the resistivity of the peripheral portion of the electrode part 42 and the resistivity of a central portion of the electrode part 42 are set to different values by adjusting concentrations of boron added to the silicon in the peripheral portion of the electrode part 42 and in the central portion of the electrode part 42. The resistivity of the peripheral portion of the electrode part 42 and the resistivity of the central portion of the electrode part 42 may be set to different values within a range of 0.01 mΩcm to 100 Ωcm. For example, the resistivity of the central portion of the electrode part 42 is set to a value larger than the resistivity of the peripheral portion of the electrode part 42 by adjusting the concentration of the boron in the silicon in the central portion of the electrode part 42 to a value larger than the concentration of the boron in the silicon in the peripheral portion of the electrode part 42. Accordingly, the impedance of the central portion of the electrode part 42 with respect to the plasma becomes larger than that of the peripheral portion of the electrode part 42. Further, for example, the resistivity of the central portion of the electrode part 42 is set to a value smaller than the resistivity of the peripheral portion of the electrode part 42 by adjusting the concentration of the boron in the silicon in the central portion of the electrode part 42 to a value smaller than the concentration of the boron in the silicon in the peripheral portion of the electrode part 42. Accordingly, the impedance of the central portion of the electrode part 42 with respect to the plasma becomes smaller than that of the peripheral portion of the electrode part 42.

Referring back to FIG. 1, the gas introduction port 46 of the plate-like member 41 is connected with a gas supply pipe 47. The gas supply pipe 47 is connected with a processing gas source 48. The gas supply pipe 47 is provided with a mass flow controller (MFC) 49 and an opening/closing valve V1 sequentially from its upstream side. And, as a processing gas for etching, a gas such as, for example, a fluorocarbon gas ($C_xF_y$) including $C_4F_8$ gas is supplied from the processing gas source 48 to the gas diffusion chamber 43 through the gas supply pipe 47, and then, supplied into the processing chamber 21. The gas supply pipe 47, the processing gas supply source 48, and the upper electrode 4 constitute a processing gas supply unit.

The upper electrode 4 is electrically connected to a variable DC power supply 52 through a low pass filter (LPF) 51. The variable DC power supply 52 is configured to turn ON/OFF power feeding by an ON/OFF switch 53. The current/voltage of the variable DC power source 52 and the ON/OFF of the ON/OFF switch 53 is adapted to be controlled by a controller 54.

Further, when a high frequency power is applied to the susceptor 24 from first and second high frequency power supplies 62, 64 to generate plasma in the plasma processing space, the ON/OFF switch 53 is turned ON by the controller 54 so that a predetermined negative DC voltage is applied to the upper electrode 4. A cylindrical grounding conductor 21a is provided to extend above a height position of the upper electrode 4 from the side wall of the processing chamber 21. The grounding conductor 21a has an upper wall in its upper portion.

The susceptor 24, serving as the lower electrode, is electrically connected with the first high frequency power supply 62 through a matcher 61. Further, the susceptor 24 is electrically connected with the second high frequency power supply 64 through a matcher 63. The first high frequency power supply 62 has a role to generate plasma in the plasma processing space between the upper electrode 4 and the susceptor 24 by outputting a power having a high frequency of 27 MHz or more, for example, 40 MHz. An etching processing is performed on the wafer W by the plasma generated in the plasma processing space. The second high frequency power supply 64 has a role to draw ion species generated by outputting a power having a high frequency of 13.56 MHz or less, for example, 2 MHz, to the wafer W held on the electrostatic chuck.

An exhaust port 71 is formed on the bottom of the processing chamber 21, and the exhaust port 71 is connected with an exhaust device 73, serving as an exhaust unit, through an exhaust pipe 72. The exhaust device 73 includes, for example, a vacuum pump, and is able to decompress the inside of the processing chamber 21 to a desired vacuum pressure. Further, a wafer W carrying-in/out port 74 is formed on the side wall of the processing chamber 21, and the carrying-in/out port 74 may be opened or closed by a gate valve 75.

Reference numerals "76" and "77" in the drawing denote deposit shields. The deposit shield 76 is provided along the inner wall surface of the processing chamber 21. The deposit shield has a role to suppress any etching byproducts (deposits) from adhering to the processing chamber 21, and is detachably provided on the inner wall surface. A conductive member (GND block) 79 is provided on a portion of the deposit shield 76 constituting the inner wall of the processing chamber 21 at substantially the same height position as the wafer W and connected to a ground in a DC mode. As a result, an abnormal discharge is suppressed.

According to the present exemplary embodiment, since the electrode part 42 is formed in a film shape by thermally spraying silicon onto the surface 41a of the plate-like member 41 where the outlets of the gas distribution holes 43a are formed, it is possible to avoid a situation where a gap serving as a thermal resistance is generated between the plate-like member 41 and the electrode part 42. As a result, according to the present exemplary embodiment, since the uniformity of the temperature of the upper electrode 4 including the plate-like member 41 and the electrode part 42 may be maintained, a uniform plasma processing may be performed on the entire processing target surface of the wafer W.

Meanwhile, since the upper electrode 4 is disposed to face the susceptor 24 across the plasma processing space in the processing chamber 21, the electrode part 42 of the upper electrode 4 is consumed due to damage caused by plasma. According to the present exemplary embodiment, since the electrode part 42 is formed in a film shape by thermally spraying silicon onto the surface 41a of the plate-like member 41 where the outlets of the gas distribution holes 43a are formed, the electrode part 42 may be easily formed by thermally spraying silicon again even in a case where the electrode part 42 of the upper electrode 4 is consumed. As a result, according to the present exemplary embodiment, since it is unnecessary to replace the entire upper electrode 4, an increase in cost associated with the replacement may be suppressed.

Further, according to the present exemplary embodiment, since the resistivity of the peripheral portion of the electrode part 42 and the resistivity of the central portion of the electrode part 42 are set to different values, the impedance of the electrode part 42 with respect to plasma may be controlled properly. As a result, according to the present exemplary embodiment, a uniform plasma processing may be performed on the entire processing target surface of the wafer W.

In the above-mentioned exemplary embodiment, the upper electrode 4 has been described as an example, in which the resistivity of the peripheral portion of the electrode part 42 and the resistivity of the central portion of the electrode part 42 are set to different values by adjusting the concentrations of boron added to the silicon in the peripheral portion of the electrode part 42 and in the central portion of the electrode part 42. However, exemplary embodiments are not limited thereto. Hereinafter, modified examples of the upper electrode 4 will be described.

Figure 3:
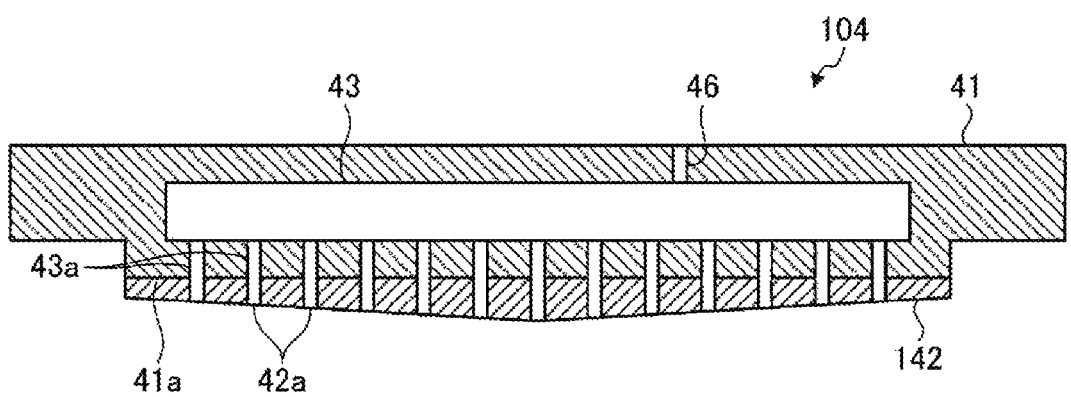
FIG. 3 is a vertical-sectional view illustrating modified example 1 of the upper electrode according to the exemplary embodiment.

FIG. 3 is a vertical-sectional view illustrating modified example 1 of the upper electrode according to the exemplary embodiment. An upper electrode 104 according to modified example 1 is different from the upper electrode 4 illustrated in FIG. 2 in that an electrode part 142 is provided in place of the electrode part 42. Accordingly, for the same configurations as the upper electrode 4 illustrated in FIG. 2, the descriptions thereof will be omitted.

As illustrated in FIG. 3, in the upper electrode 104 of modified example 1, the resistivity of the peripheral portion of the electrode part 142 and the resistivity of the central portion of the electrode part 142 are set to different values by adjusting the film thicknesses of silicon in the peripheral portion of the electrode part 142 and in the central portion of the electrode part 142. Preferably, the resistivity of the peripheral portion of the electrode part 142 and the resistivity of the central portion of the electrode part 142 are set to different values within a range of 0.01 mΩcm to 100 Ωcm. In this example, the resistivity of the central portion of the electrode part 142 is set to a value larger than the resistivity of the peripheral portion of the electrode part 142 by adjusting the film thickness of the silicon in the central portion of the electrode part 142 to a value larger than the film thickness of the silicon in the peripheral portion of the electrode part 142. Accordingly, the impedance of the central portion of the electrode part 142 with respect to the plasma becomes larger than that of the peripheral portion of the electrode part 142.

According to the upper electrode 104 of modified example 1, since the resistivity of the central portion of the electrode part 142 is set to a value larger than the resistivity of the peripheral portion of the electrode part 142 by adjusting the film thickness of the silicon in the central portion of the electrode part 142 to a value larger than the film thickness of the silicon in the peripheral portion of the electrode part 142, the impedance of the electrode part 142 with respect to the plasma may be controlled properly. As a result, according to the upper electrode 104 of modified example 1, a uniform plasma processing may be performed on the entire processing target surface of the wafer W.

Figure 4:
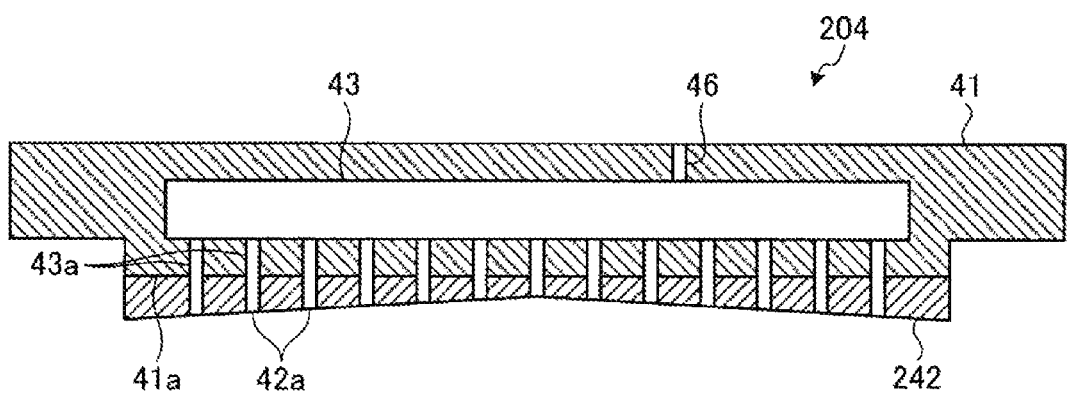
FIG. 4 is a vertical-sectional view illustrating modified example 2 of the upper electrode according to the exemplary embodiment.

FIG. 4 is a vertical-sectional view illustrating modified example 2 of the upper electrode according to the exemplary embodiment. An upper electrode 204 according to modified example 2 is different from the upper electrode 4 illustrated in FIG. 2 in that an electrode part 242 is provided in place of the electrode part 42. Accordingly, for the same configurations as the upper electrode 4 illustrated in FIG. 2, the descriptions thereof will be omitted.

As illustrated in FIG. 4, in the upper electrode 204 of modified example 2, the resistivity of the peripheral portion of the electrode part 242 and the resistivity of the central portion of the electrode part 242 are set to different values by adjusting the film thicknesses of silicon in the peripheral portion of the electrode part 242 and in the central portion of the electrode part 242. The resistivity of the peripheral portion of the electrode part 242 and the resistivity of the central portion of the electrode part 242 are set to different values within a range of 0.01 mΩcm to 100 Ωcm. In this example, the resistivity of the central portion of the electrode part 242 is set to a value smaller than the resistivity of the peripheral portion of the electrode part 242 by adjusting the film thickness of the silicon in the central portion of the electrode part 242 to a value smaller than the film thickness of the silicon in the peripheral portion of the electrode part 242. Accordingly, the impedance of the central portion of the electrode part 242 with respect to the plasma becomes smaller than that of the peripheral portion of the electrode part 242.

According to the upper electrode 204 of modified example 2, since the resistivity of the central portion of the electrode part 242 is set to a value smaller than the resistivity of the peripheral portion of the electrode part 242 by adjusting the film thickness of the silicon in the central portion of the electrode part 242 to a value smaller than the film thickness of the silicon in the peripheral portion of the electrode part 242, the impedance of the electrode part 242 with respect to the plasma may be controlled properly. As a result, according to the upper electrode 204 of modified example 2, a uniform plasma processing may be performed on the entire processing target surface of the wafer W.

Figure 5:
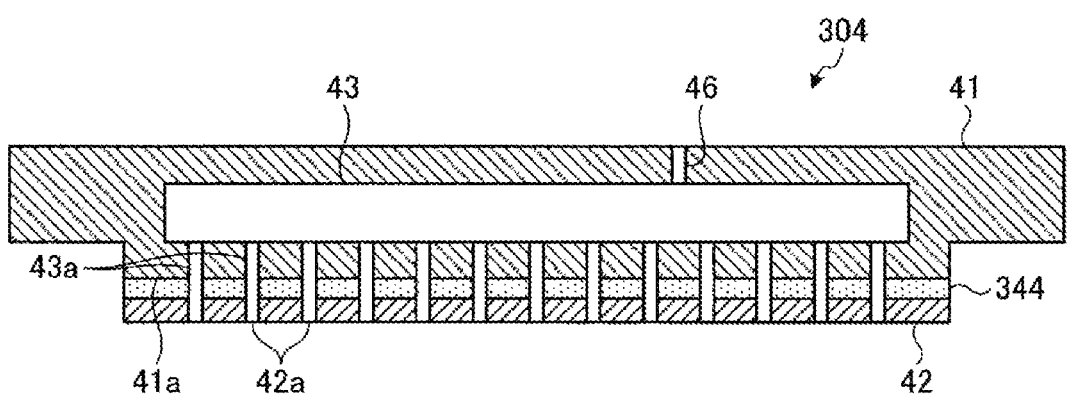
FIG. 5 is a vertical-sectional view illustrating modified example 3 of the upper electrode according to the exemplary embodiment.

FIG. 5 is a vertical-sectional view illustrating modified example 3 of the upper electrode according to the exemplary embodiment. An upper electrode 304 according to modified example 3 is different from the upper electrode 4 illustrated in FIG. 2 in that a ceramic film part 344 is formed between the plate-like member 41 and the electrode part 42. Accordingly, for the same configurations as the upper electrode 4 illustrated in FIG. 2, the descriptions thereof will be omitted.

As illustrated in FIG. 5, the upper electrode 304 of modified example 3 includes a ceramic film part 344 formed in a film shape by thermally spraying ceramic between the plate-like member 41 and the electrode part 42. As the ceramic thermally sprayed between the plate-like member 41 and the electrode part 42, alumina ($Al_2O_3$) or Yttria ($Y_2O_3$) may be used, for example. In this example, the ceramic film part 344 is formed over the entire surfaces of the plate-like member 41 and the electrode part 42.

Meanwhile, the ceramic film part 344 includes openings overlapped with the gas distribution holes 43a of the plate-like member 41 and the gas introduction holes 42a of the electrode part 42. Therefore, the processing gas supplied to the gas diffusion chamber 43 is diffused in a shower form and supplied into the processing chamber 21 through the gas distribution holes 43a, the openings of the ceramic film part 344, and the gas introduction holes 42a.

According to the upper electrode 304 of modified example 3, by the ceramic film part 344, the plate-like member 41 may be protected from the plasma and the impedance of the electrode part 42 with respect to the plasma may be controlled properly. As a result, according to the upper electrode 304 of modified example 3, a uniform plasma processing may be performed on the entire processing target surface of the wafer W.

Figure 6:
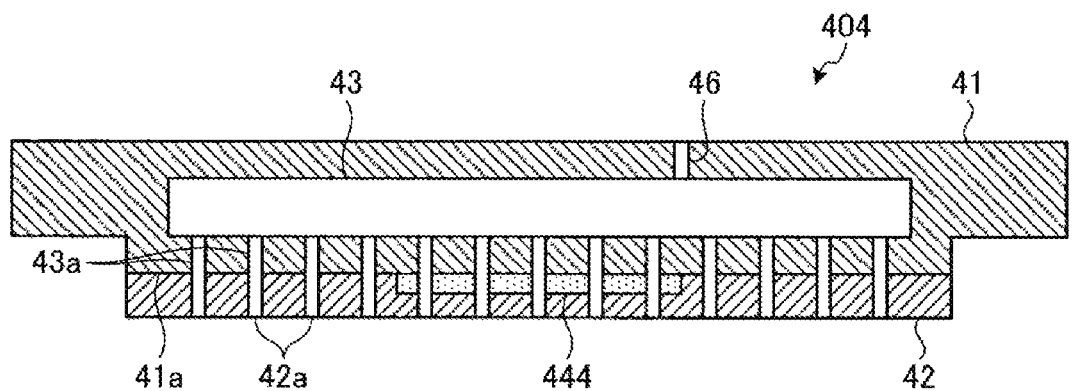
FIG. 6 is a vertical-sectional view illustrating modified example 4 of the upper electrode according to the exemplary embodiment.

FIG. 6 is a vertical-sectional view illustrating modified example 4 of the upper electrode according to the exemplary embodiment. An upper electrode 404 according to modified example 4 has the same configuration as that of the upper electrode 304 illustrated in FIG. 5, but is different from the upper electrode 304 illustrated in FIG. 5 in that a ceramic film part 444 is provided in place of the ceramic film part 344. Accordingly, for the same configurations as the upper electrode 304 illustrated in FIG. 5, the descriptions thereof will be omitted.

As illustrated in FIG. 6, the upper electrode 404 of modified example 4 includes a ceramic film part 444 formed in a film shape by thermally spraying ceramic between the plate-like member 41 and the electrode part 42. As the ceramic thermally sprayed between the plate-like member 41 and the electrode part 42, alumina ($Al_2O_3$) or Yttria ($Y_2O_3$) may be used, for example. The ceramic film part 444 is formed at a position corresponding to the central portion of the electrode part 42. That is, in the electrode 404 of modified example 4, the ceramic film part 344 is formed only at a position corresponding to the central portion of the electrode part 42, rather than being formed over the entire surface of the electrode part 42.

According to the upper electrode 404 of modified example 4, by the ceramic film part 444 formed at a position corresponding to the central portion of the electrode part 42, the plate-like member 41 may be protected from the plasma and the impedance of the central portion of the electrode part 42 with respect to the plasma may be increased. As a result, according to the upper electrode 404 of modified example 4, a uniform plasma processing may be performed on the entire processing target surface of the wafer W.

Figure 7:
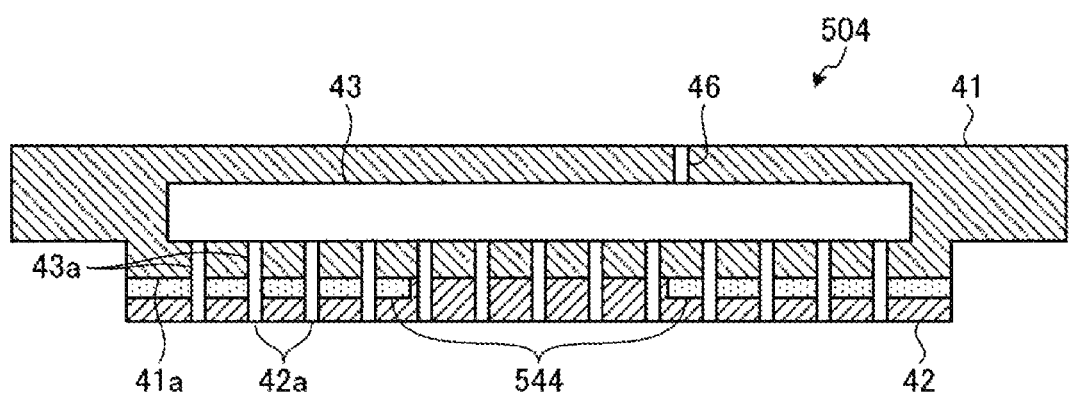
FIG. 7 is a vertical-sectional view illustrating modified example 5 of the upper electrode according to the exemplary embodiment.

FIG. 7 is a vertical-sectional view illustrating modified example 5 of the upper electrode according to the exemplary embodiment. An upper electrode 504 according to modified example 5 is different from the upper electrode 304 illustrated in FIG. 5 in that a ceramic film part 544 is provided in place of the ceramic film part 344. Accordingly, for the same configurations as the upper electrode 304 illustrated in FIG. 5, the descriptions thereof will be omitted.

As illustrated in FIG. 7, the upper electrode 504 of modified example 5 includes a ceramic film part 544 formed in a film shape by thermally spraying ceramic between the plate-like member 41 and the electrode part 42. As the ceramic thermally sprayed between the plate-like member 41 and the electrode part 42, alumina ($Al_2O_3$) or Yttria ($Y_2O_3$) may be used, for example. The ceramic film part 544 is formed at a position corresponding to the peripheral portion of the electrode part 42. That is, in the electrode 504 of modified example 5, the ceramic film part 544 is only at a position corresponding to the peripheral portion of the electrode part 42 rather than being formed over the entire surface of the electrode part 42.

According to the upper electrode 504 of modified example 5, by the ceramic film part 544 formed at a position corresponding to the peripheral portion of the electrode part 42, the plate-like member 41 may be protected from the plasma and the impedance of the peripheral portion of the electrode part 42 with respect to the plasma may be controlled properly. As a result, according to the upper electrode 504 of modified example 5, a uniform plasma processing may be performed on the entire processing target surface of the wafer W.

Figure 8:
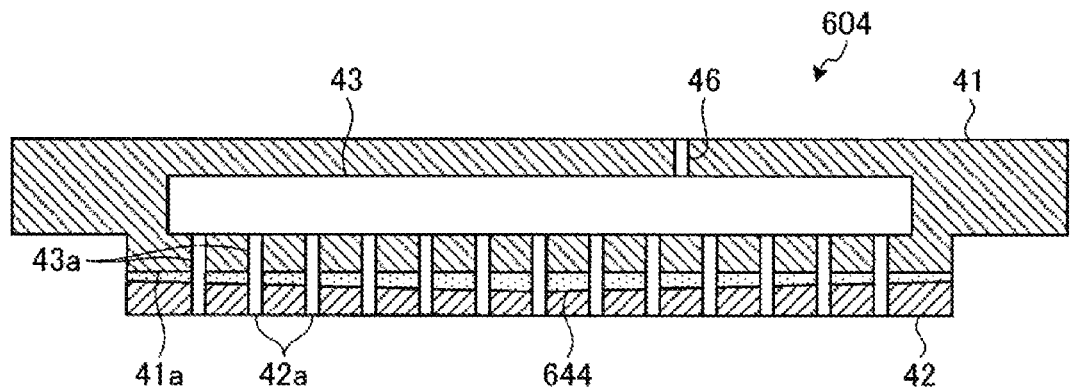
FIG. 8 is a vertical-sectional view illustrating modified example 6 of the upper electrode according to the exemplary embodiment.

FIG. 8 is a vertical-sectional view illustrating modified example 6 of the upper electrode according to the exemplary embodiment. An upper electrode 604 according to modified example 6 is different from the upper electrode 304 illustrated in FIG. 5 in that a ceramic film part 644 is provided in place of the ceramic film part 344. Accordingly, for the same configurations as the upper electrode 304 illustrated in FIG. 5, the descriptions thereof will be omitted.

As illustrated in FIG. 8, the upper electrode 604 of modified example 6 includes a ceramic film part 644 formed in a film shape by thermally spraying ceramic between the plate-like member 41 and the electrode part 42. As the ceramic thermally sprayed between the plate-like member 41 and the electrode part 42, alumina ($Al_2O_3$) or Yttria ($Y_2O_3$) may be used, for example. The film thickness of the ceramic film part 644 is set to be different between the position corresponding to the peripheral portion of the electrode part 42 and the position corresponding to the central portion of the electrode part 42. In this example, the film thickness of the ceramic film part 644 at the position corresponding to the central portion of the electrode part 42 is set to a value larger than the film thickness of the ceramic film part 644 at the position corresponding to the peripheral portion of the electrode part 42. Therefore, the impedance of the central portion of the electrode part 42 with respect to the plasma may become larger than that of the peripheral portion of the electrode part 42.

According to the upper electrode 604 of modified example 6, since the film thickness of the ceramic film part 644 at the position corresponding to the central portion of the electrode part 42 is set to a value larger than the film thickness of the ceramic film part 644 at the position corresponding to the peripheral portion of the electrode part 42, the impedance of the electrode part 42 with respect to the plasma may be controlled properly. As a result, according to the upper electrode 604 of modified example 6, a uniform plasma processing may be performed on the entire processing target surface of the wafer W.

Figure 9:
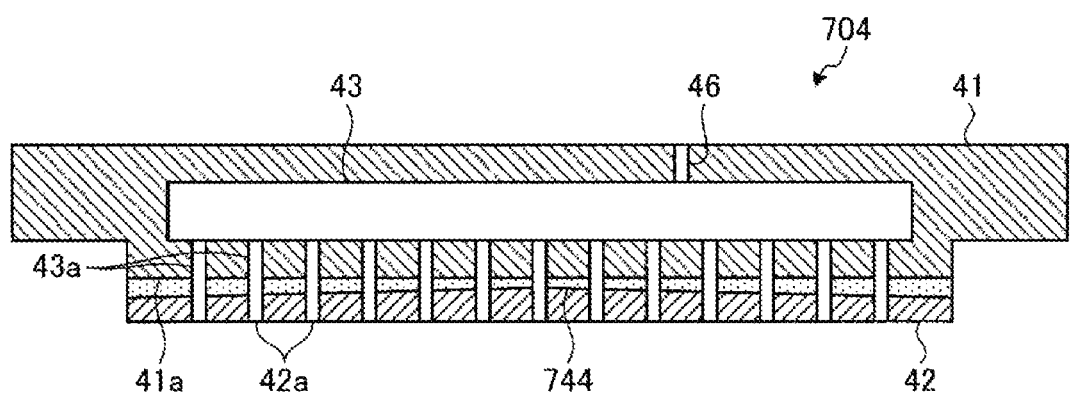
FIG. 9 is a vertical-sectional view illustrating modified example 7 of the upper electrode according to the exemplary embodiment.

FIG. 9 is a vertical-sectional view illustrating modified example 7 of the upper electrode according to the exemplary embodiment. An upper electrode 704 according to modified example 7 has the same configuration as that of the upper electrode 304 illustrated in FIG. 5, but is different from the upper electrode 304 illustrated in FIG. 5 in that a ceramic film part 744 is provided in place of the ceramic film part 344. Accordingly, for the same configurations as the upper electrode 304 illustrated in FIG. 5, the descriptions thereof will be omitted.

As illustrated in FIG. 9, the upper electrode 704 of modified example 7 includes a ceramic film part 744 formed in a film shape by thermally spraying ceramic between the plate-like member 41 and the electrode part 42. As the ceramic thermally sprayed between the plate-like member 41 and the electrode part 42, alumina ($Al_2O_3$) or Yttria ($Y_2O_3$) may be used, for example. The film thickness of the ceramic film part 744 is set to be different between the position corresponding to the peripheral portion of the electrode part 42 and the position corresponding to the central portion of the electrode part 42. In this example, the film thickness of the ceramic film part 744 at the position corresponding to the central portion of the electrode part 42 is set to a value smaller than the film thickness of the ceramic film part 744 at the position corresponding to the peripheral portion of the electrode part 42. Therefore, the impedance of the central portion of the electrode part 42 with respect to the plasma may become smaller than that of the peripheral portion of the electrode part 42.

According to the upper electrode 704 of modified example 7, since the film thickness of the ceramic film part 744 at the position corresponding to the central portion of the electrode part 42 is set to a value smaller than the film thickness of the ceramic film part 744 at the position corresponding to the peripheral portion of the electrode part 42, the impedance of the electrode part 42 with respect to the plasma may be controlled properly. As a result, according to the upper electrode 704 of modified example 7, a uniform plasma processing may be performed on the entire processing target surface of the wafer W.

As described above, according to the plasma processing apparatus of the present exemplary embodiment, since the electrode part 42 is formed in a film shape by thermally spraying silicon onto the surface 41a of the plate-like member 41 where the outlets of the gas distribution holes 43a are formed, it is possible to avoid a situation where a gap serving as a thermal resistance is generated between the plate-like member 41 and the electrode part 42. As a result, according to the present exemplary embodiment, since the uniformity of the temperature of the upper electrode 4 including the plate-like member 41 and the electrode part 42 may be maintained, a uniform plasma processing may be performed on the entire processing target surface of the wafer W.

DESCRIPTION OF SYMBOL

1: plasma processing apparatus
4, 104, 204, 304, 404, 504, 604, 704: upper electrode
21: processing chamber (processing container)
24: susceptor (lower electrode)
25: electrostatic chuck
41: plate-like member
41a: surface
42, 142, 242: electrode part
42a: gas introduction hole
43: gas diffusion chamber
43a: gas distribution hole (flow path)
344, 444, 544, 644, 744: ceramic film part

What is claimed is:

1. An upper electrode comprising:
   a metal plate provided with a plurality of flow paths that distributes a processing gas used for a plasma processing; and
   an electrode having a film structure made of silicon, the film structure having a central portion with a thickness in a central portion of the film structure which is different than a thickness in a peripheral portion of the film structure, and wherein the film structure is thermally sprayed onto a surface of the metal plate where an outlet of each of the plurality of flow paths is formed such that the central portion of the film structure has the thickness different from the thickness in the peripheral portion of the film structure, wherein the electrode includes a plurality of gas introduction holes through which the processing gas is supplied.

2. The upper electrode of claim 1, wherein a resistivity of the peripheral portion of the film structure and a resistivity of the central portion of the film structure have different values.

3. The upper electrode of claim 2, wherein the resistivity of the peripheral portion of the film structure and the resistivity of the central portion of the film structure have different values within a range of 0.01 mΩcm to 100 Ωcm.

4. The upper electrode of claim 1, wherein each of the plurality of gas introduction holes of the electrode is formed to overlap with the outlet of each of the plurality of flow paths of the metal plate.

5. The upper electrode of claim 1, wherein the thickness in the central portion of the film structure is larger than the thickness in the peripheral portion of the film structure.

6. A plasma processing apparatus comprising:
a processing container configured to define a plasma processing space;
a lower electrode provided in the processing container and configured to place a substrate to be processed thereon; and
an upper electrode disposed to face the lower electrode across the plasma processing space,
wherein the upper electrode includes:
a metal plate provided with a plurality of flow paths that distributes a processing gas used for a plasma processing; and
an electrode having a film structure made of silicon, the film structure having a central portion with a thickness in a central portion of the film structure which is different than a thickness in a peripheral portion of the film structure, and wherein the film structure is thermally sprayed onto a surface of the metal plate where an outlet of each of the plurality of flow paths is formed such that the central portion of the film structure has the thickness different from the thickness in the peripheral portion of the film structure,
wherein the electrode includes a plurality of gas introduction holes through which the processing gas is supplied.

7. The plasma processing apparatus of claim 6, wherein each of the plurality of gas introduction holes of the electrode is formed to overlap with the outlet of each of the plurality of flow paths of the metal plate.

8. The plasma processing apparatus of claim 6, wherein the thickness in the central portion of the film structure is larger than the thickness in the peripheral portion of the film structure.

* * * * *